United States Patent
Haehner et al.

(10) Patent No.: US 10,900,878 B2
(45) Date of Patent: Jan. 26, 2021

(54) TORSIONAL AND LATERAL STIFFNESS MEASUREMENT

(71) Applicant: University Court of the University of St Andrews, St Andrews (GB)

(72) Inventors: Georg Haehner, St Andrews (GB); John Parkin, St Andrews (GB)

(73) Assignee: University Court of the University of St Andrews, St Andrews (GB)

( * ) Notice: Subject to any disclaimer, the term of this patent is extended or adjusted under 35 U.S.C. 154(b) by 377 days.

(21) Appl. No.: 14/417,621

(22) PCT Filed: Aug. 15, 2013

(86) PCT No.: PCT/GB2013/052167
§ 371 (c)(1),
(2) Date: Jan. 27, 2015

(87) PCT Pub. No.: WO2014/041331
PCT Pub. Date: Mar. 20, 2014

(65) Prior Publication Data
US 2015/0219537 A1   Aug. 6, 2015

(30) Foreign Application Priority Data
Sep. 17, 2012   (GB) .................................. 1216529.6

(51) Int. Cl.
*G01N 3/02* (2006.01)
*G01M 5/00* (2006.01)
(Continued)

(52) U.S. Cl.
CPC ............. *G01N 3/02* (2013.01); *B81C 99/003* (2013.01); *G01M 5/0041* (2013.01);
(Continued)

(58) Field of Classification Search
CPC .. G01N 3/02; G01N 3/32; G01N 3/62; G01N 2203/0005; G01N 2203/0023;
(Continued)

(56) References Cited

U.S. PATENT DOCUMENTS 3,452,928 A * 7/1969 Stark ........................ G01K 5/70
236/44 R
5,731,524 A 3/1998 Matsumoto et al.
(Continued)

FOREIGN PATENT DOCUMENTS

EP   2648005 A1   10/2013
JP   2004-286729 A   10/2004
(Continued)

OTHER PUBLICATIONS

H. Lee and et al, "Coupled lateral bending—torsional vibration sensitivity of atomic force microscope cantilever", Elsevier, Ultramicroscopy 108 (2008) 707-711.*
(Continued)

*Primary Examiner* — Alexander Satanovsky
*Assistant Examiner* — Douglas Kay
(74) *Attorney, Agent, or Firm* — Alston & Bird LLP

(57) ABSTRACT

A method for determining a spring constant/rigidity of a cantilever of a known shape, the method involving: measuring a resonance frequency of the cantilever in a plurality of static equilibrium positions in which the shape of the cantilever is different and determining a spring constant and/or rigidity of the cantilever using the measured frequencies. The resonance frequency may be at least one of a torsional and lateral resonance frequency.

19 Claims, 5 Drawing Sheets

(51) Int. Cl.
B81C 99/00 (2010.01)
G01N 3/32 (2006.01)
G01Q 40/00 (2010.01)
G01N 3/62 (2006.01)

(52) U.S. Cl.
CPC ........ *G01M 5/0058* (2013.01); *G01M 5/0066* (2013.01); *G01N 3/32* (2013.01); *G01N 3/62* (2013.01); *G01Q 40/00* (2013.01); *B81B 2203/0118* (2013.01); *G01N 2203/0005* (2013.01); *G01N 2203/0023* (2013.01); *G01N 2203/0048* (2013.01); *G01N 2203/0055* (2013.01); *G01N 2203/0254* (2013.01); *G01N 2203/0286* (2013.01); *G01N 2203/0688* (2013.01)

(58) Field of Classification Search
CPC ... G01N 2203/0048; G01N 2203/0055; G01N 2203/0254; G01N 2203/0286; G01N 2203/0688; B81C 99/003; G01M 5/0041; G01M 5/0058; G01M 5/0066; G01Q 40/00; B81B 2203/0118
USPC .......................................................... 702/43
See application file for complete search history.

(56) References Cited

U.S. PATENT DOCUMENTS

| | | | | |
|---|---|---|---|---|
| 5,930,594 | A * | 7/1999 | Vilain | B81B 3/007 438/52 |
| 6,691,583 | B2 * | 2/2004 | Rieder | G01F 1/8409 73/861.357 |
| 7,010,989 | B2 * | 3/2006 | Rieder | G01F 1/8409 73/861.357 |
| 8,721,282 | B2 * | 5/2014 | Thomas | B64C 3/52 416/24 |
| 2002/0162388 | A1 | 11/2002 | Proksch | |
| 2002/0163053 | A1 * | 11/2002 | Behin | G01D 21/02 257/414 |
| 2002/0166368 | A1 * | 11/2002 | Yamanaka | G01Q 40/00 73/105 |
| 2004/0020279 | A1 * | 2/2004 | Degertekin | B82Y 35/00 73/105 |
| 2005/0092104 | A1 * | 5/2005 | Rieder | G01F 1/8418 73/861.357 |
| 2006/0000293 | A1 * | 1/2006 | Rieder | G01F 1/8409 73/861.357 |
| 2007/0062252 | A1 * | 3/2007 | Proksch | G01B 5/28 73/1.79 |
| 2008/0011044 | A1 * | 1/2008 | Workman | G01Q 40/00 73/1.79 |
| 2008/0011046 | A1 * | 1/2008 | Workman | G01Q 40/00 73/1.89 |
| 2008/0011083 | A1 * | 1/2008 | Workman | G01Q 40/00 73/579 |
| 2008/0047346 | A1 * | 2/2008 | Vyas | H03H 9/2405 73/580 |
| 2008/0176757 | A1 * | 7/2008 | Hassibi | C12Q 1/6851 506/9 |
| 2009/0288479 | A1 * | 11/2009 | Woody | B01F 11/0088 73/105 |
| 2010/0018310 | A1 * | 1/2010 | Mutharasan | G01N 5/025 73/579 |
| 2010/0071477 | A1 * | 3/2010 | Haehner | G01F 1/20 73/861.18 |
| 2010/0120023 | A1 * | 5/2010 | Sahin | B82Y 35/00 435/6.19 |
| 2012/0227139 | A1 | 9/2012 | Yasutake et al. | |
| 2012/0278005 | A1 * | 11/2012 | Sumi | A61B 8/08 702/43 |
| 2013/0064666 | A1 * | 3/2013 | Thomas | B64C 3/52 416/158 |
| 2013/0204592 | A1 * | 8/2013 | Dixit | G01M 5/0025 703/2 |
| 2014/0036637 | A1 * | 2/2014 | Barone | G01V 1/18 367/179 |
| 2015/0377915 | A1 * | 12/2015 | Claudel | G01P 5/02 73/170.02 |

FOREIGN PATENT DOCUMENTS

| | | |
|---|---|---|
| SU | 1532848 A1 | 12/1989 |
| WO | WO 2004/012201 A2 | 2/2004 |
| WO | WO 2008/099136 A1 | 8/2008 |
| WO | WO 2012/064193 A1 | 5/2012 |

OTHER PUBLICATIONS

C. A. Van Eysden and et al, "Resonant frequencies of a rectangular cantilever beam immersed in a fluid", Journal of Applied Physics 100, 114916, 2006.*
N. Chen and et al, "Design and Characterization of Artificial Haircell Sensor for Flow Sensing With Ultrahigh Velocity and Angular Sensitivity", Journal of microelectromechanical systems, vol. 16, No. 5, Oct. 2007. p. 999-1013.*
J. A. Turner, "Sensitivity of flexural and torsional vibration modes of atomic force microscope cantilevers to surface stiffness variations", Nanotechnology 12 (2001) 322-330, Institute of physics (IOP) publishing, Online at stacks.iop.org/Nano/12/322.*
D. F. J. Tees and et al, "A Microcantilever Device to Assess the Effect of Force on the Lifetime of Selectin-Carbohydrate Bonds", Biophysical Journal vol. 80 Feb. 2001 668-682.*
G. G. Yaralioglu and et al, "Analysis and design of an interdigital cantilever as a displacement sensor", Journal of Applied Physics 83, 7405 (1998); https://doi.org/10.1063/1.367984.*
N. Sasaki and et al, "Load dependence of the frictional-force microscopy image pattern of the graphite surface", Phys. Rev. B 57, 3785—Published Feb. 15, 1998.*
N. Sasaki and et al, "Analysis of frictional-force image patterns of a graphite surface", Journal of Vacuum Science & Technology B: Microelectronics and Nanometer Structures Processing, Measurement, and Phenomena 15, 1479 (1997); https://doi.org/10.1116/1.589479.*
I. Dufour and et al, "Theoretical Analysis of Strong-Axis Bending Mode Vibrations for Resonant Microcantilever (Bio)Chemical Sensors in Gas or Liquid Phase", Journal of Microelectromechanical Aystems, vol. 16, No. 1, Feb. 2007 (Year: 2007).*
L.B. Sharos and A. Raman, "Enhanced mass sensing using torsional and lateral resonances in microcantilevers", Applied Physics Letters, vol. 84, No. 23, Jun. 7, 2004 (Year: 2004).*
H-L Lee and A-J Chang, "Dynamic response of a cracked atomic force microscope cantilever used for nanomachining", Lee and Chang Nanoscale Research Letters 2012, 7:131 http://www.nanoscalereslett.com/content/7/1/131, Feb. 15, 2012 (Year: 2012).*
Intellectual Property Office, Search Report Under Section 17(5) for Application No. GB1216529.6, dated Oct. 26, 2012, 4 pages, Great Britain.
Green, Christopher P., et al., "Normal and Torsional Spring Constants of Atomic Force Microscope Cantilevers", *Review of Scientific Instruments*, Jun. 2004, pp. 1988-1996, vol. 75, No. 6, American Institute of Physics, U.S.A.
Mokhtari-Nezhad, F., et al., "Influence of the Tip Mass and Position on the AFM Cantilever Dynamics: Coupling between Bending, Torsion and Flexural Modes", *Ultramicroscopy*, Aug. 2009, pp. 1193-1202, vol. 109, Elsevier B.V., The Netherlands.
CSC—Elmer, "CSC—Elmer", <http://www.csc.fi/elmer>, Apr. 30, 2001 to Aug. 12, 2014, Internet Archive <http://web.archive.org/web/*/http://www.csc.fi/elmer>, 2 pages.
International Searching Authority, International Search Report for International Application No. PCT/GB2013/052167, dated Dec. 11, 2013, 4 pages, European Patent Office, The Netherlands.

* cited by examiner

TORSIONAL AND LATERAL STIFFNESS MEASUREMENT

CROSS REFERENCE TO RELATED APPLICATIONS

This application is a National Stage Application, filed under 35 U.S.C. § 371, of International Application No. PCT/GB2013/052167, filed Aug. 15, 2013, which claims priority to Great British Application No. 1216529.6, filed Sep. 17, 2012; the contents of both of which as are hereby incorporated by reference in their entirety.

BACKGROUND

Related Field

The present invention relates to a method for determining torsional and/or lateral rigidity and/or at least one torsional and/or lateral spring constant of a cantilever. The method can be used for calibrating the rigidity and the spring constants of cantilever beams in general and is applied to microcantilevers in particular.

Description of Related Art

Cantilever calibration methods may be split into three categories: static, dynamic and theoretical. In the former, stationary bending of the cantilever is monitored. These methods all require some physical contact with the cantilever or tip and therefore involve a high risk of damage.

Dynamic calibration methods monitor the cantilever's resonance frequency as a pathway to analysing the interaction of the cantilever with external influences or its response to masses attached to the cantilever. Theoretical methods use dimensions of the cantilever, and assumptions about its elastic properties and/or finite element simulations to determine the spring constant.

Most methods for calibrating the lateral spring constant are based upon static methods. Generally, they require calibration of the lateral cantilever deflection. In some of these methods a colloidal probe is attached to the cantilever. Other methods use the static twist of the cantilever by a lateral force on a tip or colloidal probe. The lateral force can be applied by moving the tip sideways into a step on a calibration grid or by scanning the cantilever up and down slopes of a known angle on a calibration sample. In other similar methods, the tip of the cantilever to be calibrated is brought into contact with another calibrated cantilever that is rotated 90 degrees with respect to the first such that its flexural deformation causes a torsional twist in the first cantilever.

Other static methods apply a load directly to the cantilever surface. This can be done by pressing one side of the cantilever into a hard surface and measuring the resulting cantilever twist, particularly for hammerhead type cantilevers. Another method is to load the cantilever with small masses off its axis, then measure the static torsional twist of the cantilever. These methods have the advantage that they do not involve friction between the tip and surface and therefore also no friction model is required. However, they still involve considerable risk of damage to the cantilever. Methods to calibrate cantilevers by means of optics also exist. Whilst these methods do not risk damage to the cantilever, they are sensitive to detector non-linearity or rely on the tilting of a calibration surface, which may have a different reflectivity (to the cantilever).

Dynamic calibration methods allow for the determination of torsional spring constants. *Normal and torsional spring constants of atomic force microscope cantilevers*, (Review of Scientific Instruments, 75, (2004), 1988-1996) describes two dynamic methods, the torsional Cleveland method and the torsional Sader method.

The torsional Cleveland method allows for the determination of torsional spring constants by off axis loading of masses on the cantilever surface. The torsional resonance frequency is recorded as a function of applied mass. Several masses have to be physically placed on the cantilever, which may cause damage. A major source of error is in the measurement of the (assumed) spherical masses via measurement of their radius. Errors may also be introduced by uncertainties in the positioning of the masses upon the cantilever. It is assumed that the cantilever shape does not change during this procedure, i.e. the cantilever remains unbent.

The torsional Sader method determines the torsional spring constant of cantilevers via their interaction with a surrounding (resting) fluid. A 'hydrodynamic function' which describes how the cantilever resonance frequency depends upon the external density and viscosity has to be determined. Once the hydrodynamic function is determined for a cantilever of a certain shape then all similar cantilevers can be calibrated, provided the cantilever length is much greater than its width and its thickness.

The spring constants of a cantilever may also be calculated theoretically. Analytical equations can be used along with knowledge of the cantilever dimensions and elastic properties to calculate the spring constants. However, large errors (30-50%) are introduced via assumptions on the elastic constants and in the measurement of the cantilever thickness. Analytical equations can only be used for simple geometries. For more complicated cantilever beams, finite element simulations can be used to calculate the spring constants.

BRIEF SUMMARY

According to one aspect of the present invention, there is provided a method for determining a spring constant/rigidity of a cantilever of a known shape, the method involving: measuring a resonance frequency of the cantilever in a plurality of static equilibrium positions in which the shape of the cantilever is different and determining a spring constant and/or rigidity of the cantilever using the measured frequencies.

The measured resonance frequency may be at least one of a torsional resonance frequency, and a lateral resonance frequency. When torsional and lateral modes are coupled both the torsional resonance frequency and the lateral resonance frequency may be measured.

The spring constant may be at least one of a torsional spring constant, and a lateral spring constant. The rigidity may be at least one of a torsional rigidity, and a lateral rigidity.

Moving the cantilever between the plurality of static equilibrium positions may be done without increasing the mass of the cantilever. For example, the cantilever may be unloaded. Avoiding adding mass to the cantilever helps reduce the risk of damage.

To move the cantilever to the plurality of static equilibrium positions, a force substantially perpendicular to a longitudinal axis of the cantilever in its unbent state may be applied, using for example a fluid flow, such as a laminar fluid flow. The cantilever may be bent in at least one of the plurality of static equilibrium positions.

The method may further comprise calculating theoretical frequencies corresponding to each static equilibrium position, and using the theoretical frequencies and the measured frequencies to determine the spring constant and/or rigidity of the cantilever. Each theoretical frequency may depend on a polar moment of inertia characteristic of a defined static equilibrium position. The theoretical frequencies may be torsional resonance and/or lateral resonance frequencies.

Determining the spring constant/rigidity may involve using a theoretical model of the cantilever in the different static equilibrium positions. The method may comprise comparing the measured frequencies, or a function of those frequencies, with the theoretical model of the cantilever in the different static equilibrium positions, and using the results of the comparison to determine the spring constant/rigidity of the cantilever.

The method may comprise modelling a variation in frequency as a function of equilibrium position and extracting from the model a normalisation factor that depends on material properties of the cantilever, calculating a normalised mode using the normalisation factor, and using the normalised mode and corresponding resonance frequency to determine the spring constant and/or rigidity of the cantilever. For example the method may be used for determining a torsional spring constant and/or rigidity of the cantilever, wherein the frequency variation is a variation in torsional frequency and the normalised mode is a normalised torsional angular mode.

The method may also be used for determining a lateral spring constant and/or rigidity of the cantilever, wherein the frequency variation is a variation in lateral frequency and the normalised mode is a normalised lateral mode.

Preferably, the resonance frequency is the fundamental resonance frequency. For example the torsional resonance frequency may be the first order/fundamental torsional resonance frequency. Optical detection techniques may be used to measure the resonance frequencies.

The method may comprise determining or measuring the shape of the cantilever in each of the plurality of static equilibrium positions and using the shape to determine the spring constant and/or rigidity of the cantilever. When the cantilever is in at least one of its static equilibrium positions, it may be bent or deflected away from its normal or natural position. The degree of bending of deflection depends on a force applied to the cantilever. The cantilever may be bent or deflected about its main longitudinal axis.

According to another aspect of the invention, there is provided a method of calibrating a cantilever based instrument using a cantilever spring constant and/or rigidity determined by the method of the first aspect of the invention.

According to yet another aspect of the invention, there is provided a system for measuring the torsional spring constant/rigidity of a cantilever, the system having means for deforming the cantilever to cause it to move to a plurality of static equilibrium positions in which the shape of the cantilever is different, measuring means for measuring a resonance frequency of the cantilever in each of the static equilibrium positions, a processor for determining the spring constant/rigidity of the cantilever using the measured resonance frequencies and a theoretical model based on a shape of the cantilever.

The means for deforming the cantilever may include means for providing a fluid flow, in particular a laminar fluid flow.

The measuring means may be adapted to measure at least one of a torsional resonance frequency, and a lateral resonance frequency. The measuring means may include optical means.

The system may be a microfluidic system and may additionally include the cantilever.

According to yet another aspect of the invention, there is provided a method for determining fluid flow and/or force applied to a cantilever of known spring constant/rigidity and known shape, the method involving: measuring a resonance frequency of the cantilever when the fluid is applied and the cantilever is in a static equilibrium position and determining the shape/deflection of the cantilever caused by the fluid flow when the cantilever is in its static equilibrium position. The fluid flow and/or force applied to the cantilever may then be determined using the measured resonance frequency and the determined shape/deflection. The measured resonance frequency may be at least one of a torsional resonance frequency, and a lateral resonance frequency. The spring constant may be at least one of a torsional spring constant, and a lateral spring constant. The rigidity may be at least one of a torsional rigidity, and a lateral rigidity.

According to still another aspect of the invention, there is provided a system for determining fluid flow and/or force applied to a cantilever of known spring constant/rigidity and known shape, the system comprising means for measuring a resonance frequency of the cantilever when the fluid is applied and the cantilever is in a static equilibrium position; means for determining the shape/deflection of the cantilever caused by the fluid flow when the cantilever is in its static equilibrium position, and means for determining the fluid flow and/or force applied to the cantilever using the measured resonance frequency and the determined shape/deflection. The measured resonance frequency may be at least one of a torsional resonance frequency, and a lateral resonance frequency. The spring constant may be at least one of a torsional spring constant, and a lateral spring constant. The rigidity may be at least one of a torsional rigidity, and a lateral rigidity.

BRIEF DESCRIPTION OF THE FIGURES

Various aspects of the invention will now be described by way of example only and with reference to the accompanying drawings, of which:

FIG. 3 (*b*) is a side view of a cantilever bent due to applied forces;

FIG. 4 (*b*) is an oscillation spectrum of a cantilever in a bent state;

DETAILED DESCRIPTION OF VARIOUS EMBODIMENTS

Figure 1:
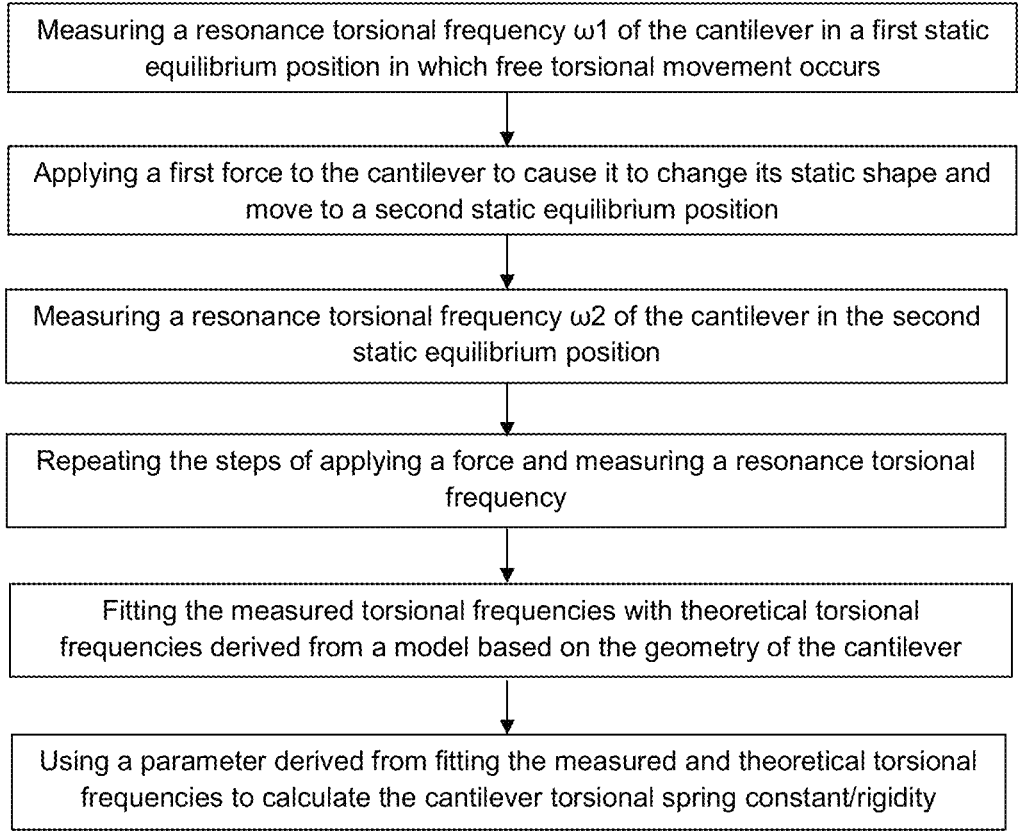
FIG. 1 is a flow diagram of a method for calculating a torsional spring constant/rigidity of a cantilever.

FIG. 1 shows the steps in a method for determining the torsional rigidity and/or the torsional spring constants of a cantilever. The method involves measuring the torsional resonant frequency of the cantilever in its natural state, in which it is in a first static equilibrium position. Then a force is applied to the cantilever to cause it to move to a second static equilibrium position. In this step, external forces are applied to the cantilever in order to change its static shape without affecting the free torsional movement of the cantilever, for example by friction or damping. Changing of the static shape has to be sufficient to result in a change of cantilever's polar moment of inertia.

Once in the second static equilibrium position, the torsional resonant frequency of the cantilever is again measured. Such a measurement is repeated for N static equilibrium positions to obtain a data set of frequencies as a function of the different forces applied to the cantilever. This data set is fitted with a theoretical model from which a normalisation factor that depends on the material properties of the cantilever is extracted. A normalised torsional angular mode is then calculated for the torsional harmonic frequency of a specific equilibrium position. Using the torsional resonance frequency and the normalised torsional angular mode of a specific equilibrium position, the torsional rigidity and/or spring constant of the cantilever are calculated. This will be described in more detail later.

Figure 2:
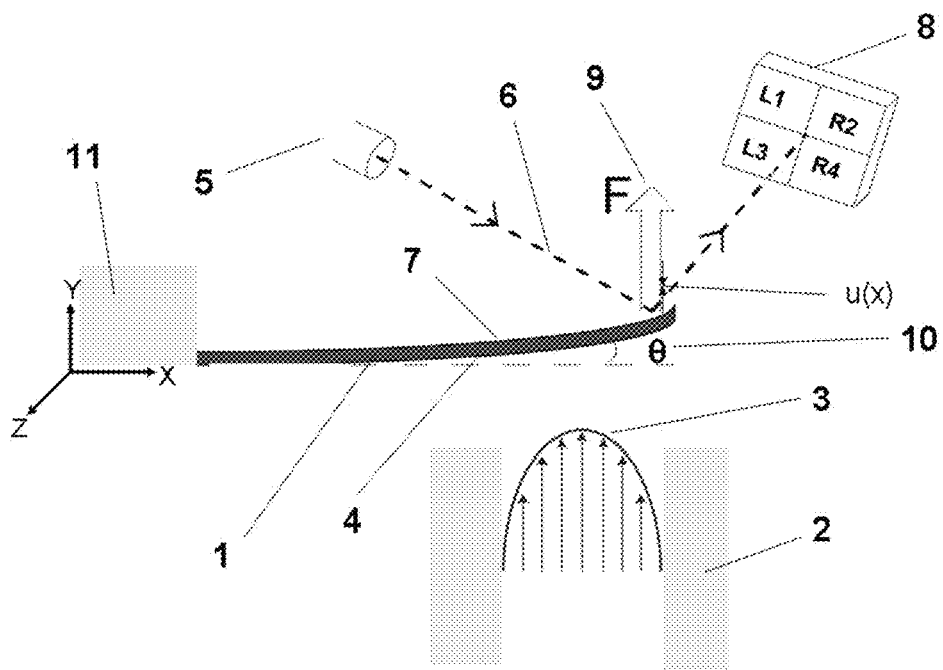
FIG. 2 is a diagram of an experimental setup for putting a cantilever in a bent static equilibrium position and for measuring the cantilever torsional resonant frequencies.

FIG. 2 shows a system for calibrating a cantilever. This has a cantilever 1 positioned above a fluid supply 2 that is arranged to provide a constant fluid flow 3 with a Poiseuille profile, for example a laminar flow. The fluid supply 2 includes a microchannel for directing the fluid onto a surface of the cantilever. The microchannel is perpendicular to a longitudinal axis of the cantilever in its natural, unbent state, so that fluid can be directed onto the cantilever in a direction perpendicular to its natural longitudinal axis. Fluid is driven through the microchannel by a pressure difference. A typical distance between the end of the microchannel and the cantilever in its unbent state is around 100 μm.

Located above the cantilever is an optical system having a laser 5 in combination with a photodetector 8. The photodetector 8 has four segments, two right segments labelled R2 and R4 and two left segments labelled L1 and L3. The laser 5 is positioned so that it can direct light onto an upper surface of the cantilever. The photodetector 8 is positioned so that light reflected from the upper surface of the cantilever is directed onto one of its four segments.

In operation, the fluid supply directs a constant fluid flow 3 onto an under surface 4 of the cantilever 1. The cantilever bends due to the constant force 9 exerted by the fluid flow 3. The static deflection angle (θ) between the tangent to the cantilever at the free end without application of a force and the tangent with application of a force is in general an indicator of the strength of the applied force: the greater the force 9, the larger the static deflection angle 10. The correct bent shape of the static deflection along the cantilever however depends on the force distribution applied to it. Bending of the cantilever triggers a change of its polar moment of inertia and therefore a shift of its torsional and lateral resonance frequencies. These torsional and lateral frequencies occur naturally through thermal excitation and are monitored by the optical system.

Figure 3:
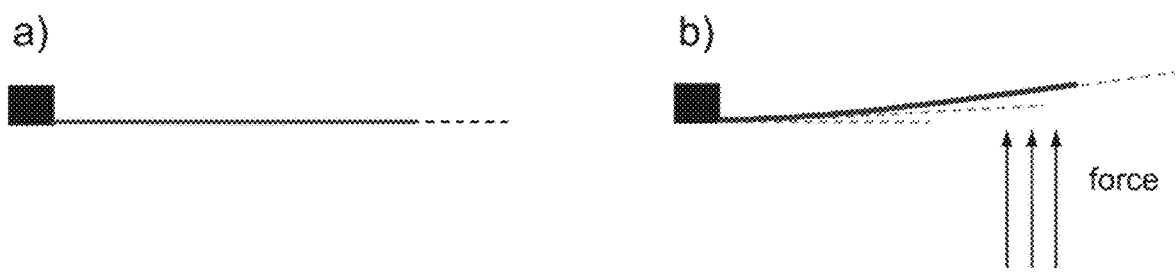
FIG. 3 (*a*) is a side view of a non-bent cantilever.

FIG. 3 shows a side-view of an unbent cantilever and a cantilever that is bent due to external forces. The dashed lines indicate the rotational axes round which free torsional rotation occurs. The axis changes along the cantilever if the cantilever is curved.

To detect the torsional frequencies, the laser 5 emits a laser beam 6 onto the top surface 7 of the cantilever. The beam 6 is reflected off the top surface of the cantilever onto the photodetector 8. The reflected laser beam moves according to the torsional frequencies, therefore hitting the four segments of the photodetector 8 in different proportions during a defined amount of time. The torsional and lateral signal is separated from the flexural signal by determining a left minus right signal ((L1+L3)−(R2+R4)), or by determining the top minus bottom signal ((L1+R2)−(L3+R4)), respectively. The time dependent signal is then Fourier transformed to obtain a frequency spectrum which reveals the torsional and lateral resonance frequencies.

Figure 4:
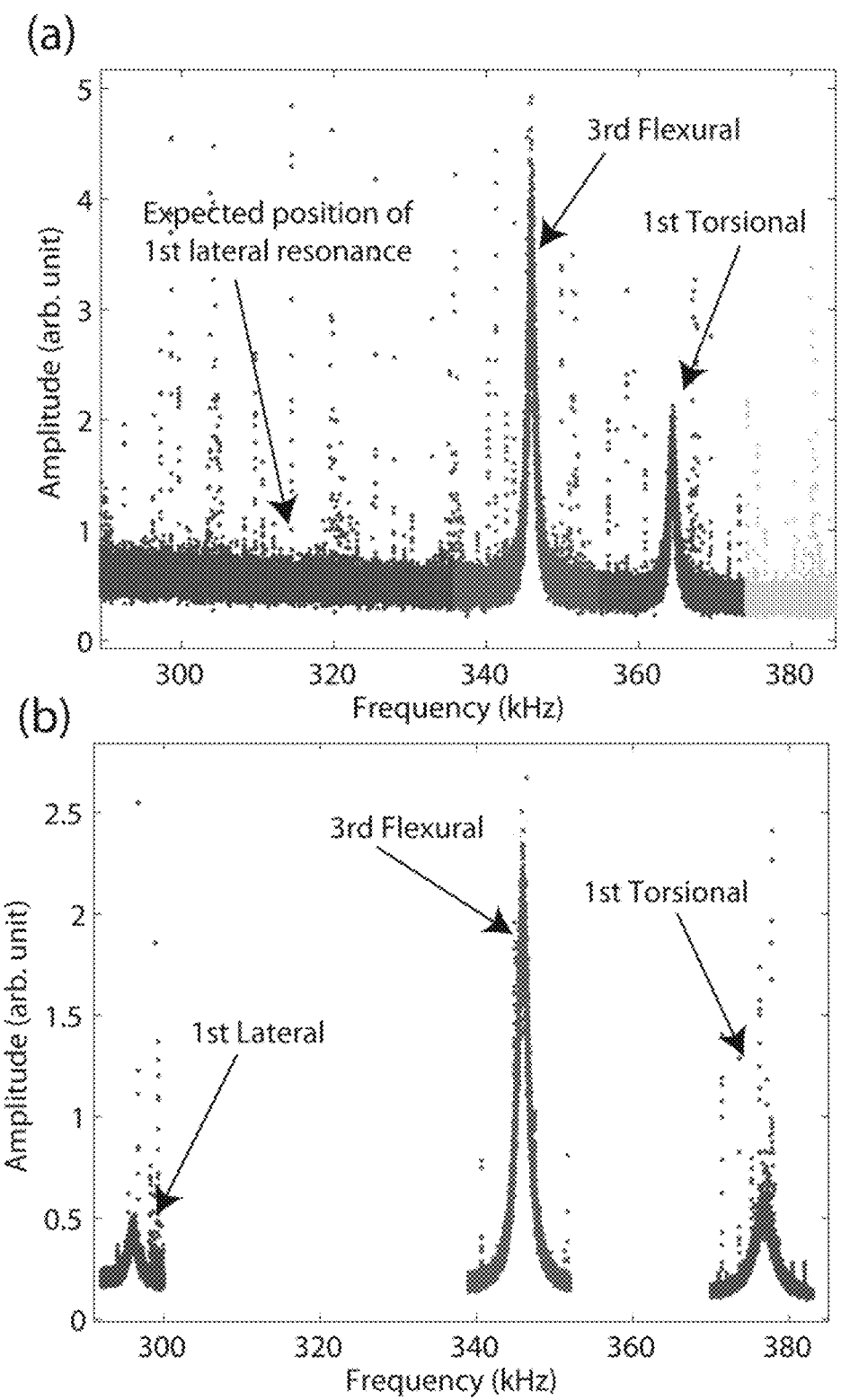
FIG. 4 (*a*) is an oscillation spectrum of a cantilever in an unbent state.

FIGS. 4(a) and 4(b) show the oscillation spectra of a rectangular cantilever in an unbent and bent state respectively. The cantilever used had the following dimensions: a nominal length 350 μm, a width of 35 μm, and a thickness of 2 μm. Both spectra were obtained by measuring the top minus bottom signal ((L1+R2)−(L3+R4)) corresponding to flexural movement, and the left minus right signal ((L1+L3)−(R2+R4)) corresponding to the torsional movement. In the unbent state (FIG. 4(a)) no lateral mode can be observed. In the bent state (FIG. 4(b)) the torsional and lateral modes couple. The first lateral peak (left) corresponds to a mostly lateral mode but which contains also some torsional movement. The first torsional peak (right) corresponds to a mostly torsional mode but which contains also some lateral movement. It is observed that a frequency of the flexural resonance mode (center) is unaffected by the deflection of the cantilever. On the other hand, cantilever deflection results in a decrease in frequency of the lateral mode and an increase in frequency of the torsional mode for this cantilever.

Bending of the cantilever has to be sufficient to result in a change of the polar moment of inertia. In general the bending has to be moderate, in the sense that it does not result in a modification of the cantilever material properties, such as a change of shear modulus for example. Deformation of the cantilever can be achieved by applying a force at any point along the length of the cantilever. The force may also be applied from the side, therefore bending the cantilever laterally. However, a complex deformation that would result in a polar moment of inertia relatively difficult to calculate may not be desirable.

The forces experienced by the cantilever depend on the setup and can be accurately determined for example via computational fluid dynamics simulations. The forces calculated for a static cantilever are sufficient. The change in the torsional oscillation energy is partially due to the change in the static equilibrium shape and the related change in the rotational inertia of the cantilever.

By measuring change in resonance frequency as a function of change in shape of the cantilever, a measure of the cantilever spring constant and rigidity can be determined. To do this for torsional spring constant and torsional rigidity, as a first approximation, it is assumed that the lateral mode has limited impact on the torsional mode, and so movement of the cantilever when in its static equilibrium position can be decomposed into independent flexural, torsional and lateral components. The differential equation governing the deflection angle of a cantilever beam undergoing torsional deformation about its major axis is given by:

$$GK\frac{\partial^2 \phi(x,t)}{\partial x^2} - \rho_c I_p \frac{\partial^2 \phi(x,t)}{\partial t^2} = m(x,t) \quad (1)$$

where φ (x,t) is the deflection angle about the major axis of the cantilever, G is the shear modulus, K is a geometric function of the cross section, $\rho_c$ is the density, L is the length, $I_p$ its polar moment of inertia about the axis of rotation, t is time, and m(x,t) is the applied torque per unit length along the beam.

Without any external torque (m=0) and with the harmonic ansatz φ(x, t)=γ(x) exp(−iωt) where, γ(x)□ is the torsional angular deviation from the equilibrium position along the cantilever, then $$GK\frac{\partial^2 \gamma(x)}{\partial x^2} - \rho_c I_p \omega^2 \gamma(x) = 0 \quad (2)$$

If the cantilever is fixed at one end (x=0) and free at the other end (x=L) the boundary conditions are γ(0)=0, dγ(L)/dx=0.

For a rectangular cantilever the differential equation (2) can be solved analytically and so the torsional eigenfrequencies, $\omega_n$, and torsional eigenmodes, $\gamma_n(x)$, are known.

Using equation (2), the eigenmodes, $\gamma_n(x)$ are given by:

$$\gamma_n(x) = \gamma_0 \sin\left(\frac{x}{L}(2n-1)\frac{\pi}{2}\right) \quad (3)$$

where n is an integer and $\gamma_0$ is a normalization factor. The normalization factor $\gamma_0$ is a function of the material properties and is a priori unknown.

Using equation (2), the torsional eigenfrequencies $\omega_{t,n}$ are given by:

$$\omega_{t,n} = \frac{(2n-1)\pi}{2L}\sqrt{\frac{GK}{\rho_c I_p}}. \quad (4)$$

For non-rectangular cantilever shapes (if the density and/or the polar moment of inertia are not constant) solutions for $\gamma_n(x)$ can be obtained by a superposition of the solutions for a rectangular cantilever or by approximating the true deflection angle, which is a function of x and y, by a function γ(x) that only depends on x. Linear combinations of the eigenmodes $\gamma_n(x)$ with eigenfrequencies $\omega_{t,n}$ describe all possible torsional oscillations of the free cantilever.

Uncalibrated torsional modal shapes are entirely determined by the geometry of the cantilever via the dependence of the parameters G, K, $I_p$ and $\rho_c$ on x (geometry). However, assuming that the cantilever is homogeneous, these not normalised modes do not depend on the material properties of the cantilever, i.e on the absolute values of parameters G, K, $I_p$ and $\rho_c$.

When the cantilever's equilibrium position deviates from the straight shape and is flexurally curved the polar moment of inertia $I_p$ changes since the rotational axes no longer coincide with the centre of the cantilever's cross section for all coordinates x along the cantilever length (see FIG. 3). As a consequence, the rotational frequency decreases. The decrease is determined by the polar moments $I_p(x)$, which depend upon the new equilibrium shape of the cantilever.

The torsional deflection modes $\gamma_n(x)$ are (almost) unaffected if the flexural deflection of the cantilever is small (i.e. if the radius of curvature of the bent cantilever is large compared to the length of the cantilever at each coordinate x.). The radius of curvature decreases as the force applied to the cantilever is increased. In this experiment the radius of curvature is around 100 m for a deflection of 6 μm measured at the free end. This can be exploited to determine the torsional spring constants $k_\square$ and the torsional rigidity, GK, of the cantilever. If the initial geometry and K are accurately known the shear modulus can also be extracted.

The geometry of the cantilever is known and both its polar moment of inertia $I_p$ and its geometric function of the cross section K can be determined. However the material properties of the cantilever such as its shear modulus G and its density $\rho_c$ are unknown. The normalization factor $\gamma_0$ depends on the material properties of the cantilever and can be extracted by fitting a function of the cantilever torsional frequency shift to a theoretical model.

Figure 5:
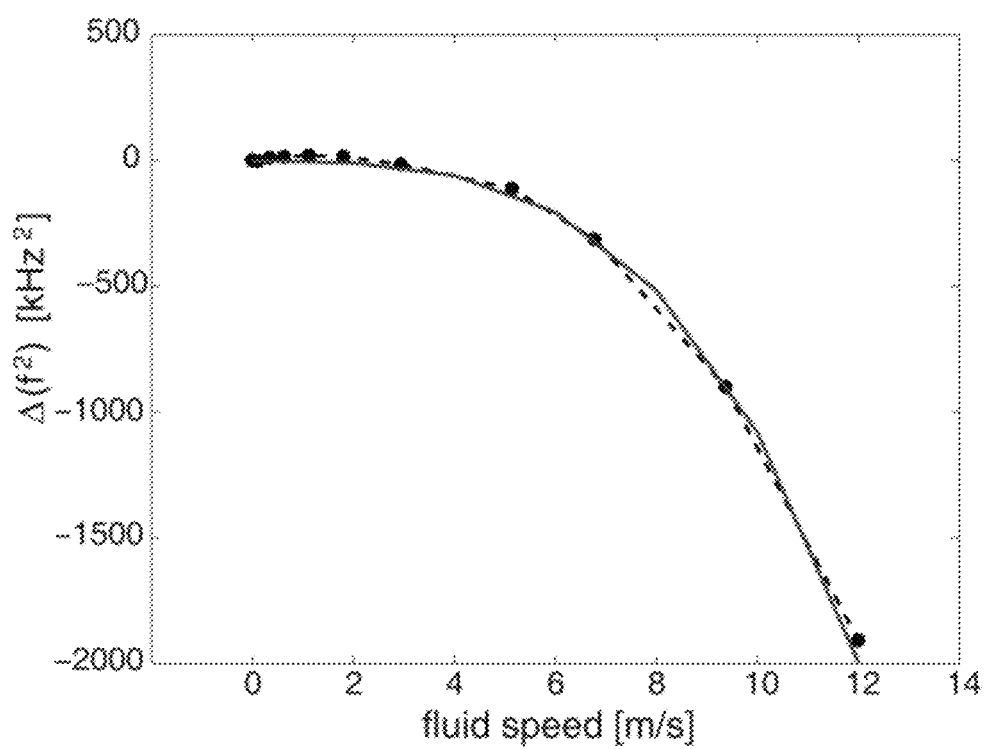
FIG. 5 is a measurement of a difference in fundamental torsional frequency squared $\Delta(f^2)$ obtained for a rectangular cantilever as a function of an applied fluid speed.

FIG. 5 is a plot of the difference in fundamental measured frequency squared $\Delta(f^2)$ for a rectangular cantilever as a function of the applied fluid speed. The black dashed line corresponds to the measured values and the red solid line to a fitted theoretical model. The cantilever used had the following dimensions: a nominal length of 350 μm (339 μm measured), a width of 35 μm (31 μm measured) and a thickness of 1 μm.

The flexural rigidity of the cantilever was determined beforehand independently to determine the resulting static bending depending on the fluid flow. The forces exerted by the fluid were determined with the open-source, multiphysics software package Elmer (http://www.csc.fi/elmer). The solver module of Elmer utilizes the Finite Element Method. The static equilibrium bending shape could also be determined by interferometric methods or by taking a photograph.

The theoretical model is derived from conservation of energy principle as follows:

The maximum kinetic energy of the oscillating cantilever in the n-th torsional mode is:

$$T = \frac{1}{2}\omega_{t,n}^2 \int_0^L \rho(x) I_p(x) \gamma_n^2(x) dx \quad (5)$$

which is equal to the energy due to maximum torsional deformation while oscillating:

$$U = \frac{1}{2}\int_0^L GK \gamma_n'^2(x) dx \quad (6)$$

The eigenmode function $\gamma_v(x)$ can be normalised such that:

$$\int_0^L \rho_c(x) I_p(x) \gamma_n^2(x) dx = 1, \quad (7)$$

The total energy of the cantilever is then given by:

$$E_{osc} = \frac{1}{2}\omega_{t,n}^2 \int_0^L \rho(x) I_p(x) \gamma_n^2(x) dx = \frac{1}{2}\omega_{t,n}^2 \quad (8)$$

When the cantilever is bent into a different equilibrium position, and therefore with a different polar moment of inertia $I_p$ and torsional frequency $\omega_{t,n}$, the energy is:

$$E_{osc} = \frac{1}{2}\hat{\omega}_{t,n}^2 \int_0^L \rho(x)(I_p(x) + \Delta I_p(x))\gamma_n^2(x)dx \quad (9)$$

$$= \frac{1}{2}\hat{\omega}_{t,n}^2 \int_0^L \rho(x)I_p(x)\gamma_n^2(x)dx + \frac{1}{2}\hat{\omega}_{t,n}^2 \int_0^L \rho(x)\Delta I_p(x)\gamma_n^2(x)dx$$

$$= \frac{1}{2}\hat{\omega}_{t,n}^2 \quad\quad\quad\quad + \frac{1}{2}\hat{\omega}_{t,n}^2 \int_0^L \rho(x)\Delta I_p(x)\gamma_n^2(x)dx$$

$$= \frac{1}{2}\hat{\omega}_{t,n}^2(1+\delta)$$

$$\left(\text{with } \delta = \int_0^L \rho(x)\Delta I_p(x)\gamma_n^2(x)dx\right)$$

The total torsional energy before and after the shape change are the same (thermal noise, since in this example the oscillations are not driven). Therefore, the change in frequency is $$\Delta(\omega_{t,n}^2) = \hat{\omega}_{t,n}^2 - \omega_{t,n}^2 = -\omega_{t,n}^2 \frac{\delta}{1+\delta} \approx -\omega_{t,n}^2 \delta \quad (10)$$

(last equal sign because $\delta \ll 1$).

The normalisation factor $\gamma_0$ is extracted by fitting the theoretical model of equation 10 with the experimental data of FIG. 5, With the normalized function $\gamma_n(x)$, the torsional spring constant $k_\Phi$ for a torque applied at the free end of the cantilever is obtained from $$k_{\Phi,n} = \frac{\omega_{t,n}^2}{\gamma_n^2(L)} \quad (11)$$

This results in a torsional spring constant $k_{\Phi,1}$ of $2.24 \times 10^{-9}$ Nm (for the first or fundamental torsional mode). For comparison: the Sader method gives a value of $2.27 \times 10^{-9}$ Nm (L=339 μm, w=31 μm, f=248.102 kHz, Q=160).

In case of atomic force microscopy the lateral spring constant $k_l$ can be obtained from $k_{\Phi,1}$ via:

$$k_l = \frac{k_{\Phi,1}}{H^2}, \quad (12)$$

where H is the height of the tip at the free end of the AFM cantilever.

The torsional rigidity, GK, for a rectangular cantilever can be obtained from:

$$GK = \frac{\omega_l^2}{\int_0^L \gamma_1'^2(x)dx} \quad (13)$$

where $\gamma_1'$ denotes the derivative of $\gamma_1$ with respect to x.

Therefore, if the geometrical dimensions of the cantilever are known it is possible to determine the torsional rigidity, the torsional spring constants and the shear modulus from the change in the torsional resonance frequencies due to a change in the moment of inertia.

The method described above is an approximation that is valid when the torsional frequency of the cantilever is less than its lateral frequency and coupling between the torsional and lateral modes has limited impact on the torsional mode. However, when this condition is not observed a more complete model, taking into account coupling between lateral, torsional and/or flexural modes should be adopted. Such a model is described below.

Depending on the amount of deflection, the torsional modes couple to the lateral and/or flexural modes. If the deflection is entirely in the direction of the flexural modes (y-direction, see FIG. 2) then the torsional oscillations couple to the lateral oscillations (in the z-direction) only.

As described above, the forces applied to the cantilever by the fluid flow cause a static flexural bending of the cantilever. The bending is such that the centroid of the cantilever and the shear-center no longer coincide, causing a coupling of the torsional and the lateral modes and therefore a change in the torsional (and lateral) resonance frequencies, which can be monitored.

If the beam vibrates, but not in a plane of symmetry, i.e. if it vibrates laterally (in the z-direction) in FIG. 2 above, then the lateral vibrations will be coupled with torsional vibrations and vice versa. In this case the centroid of the cantilever is at a distance c(x) from the shear-center. The effective distance between the centroid and the shear axis c(x) depends on the bent shape of the cantilever u(x).

The following differential equations for the position dependent part of the coupled torsional and lateral vibrations are obtained if no external torque or forces are applied:

$$\frac{\partial^2}{\partial x^2}\left(EI_y \frac{\partial^2 Z}{\partial x^2}\right) - \rho_c A\omega^2(Z(x) - c(x)\gamma(x)) = 0 \quad (14a)$$

$$GK\frac{\partial^2 \gamma(x)}{\partial x^2} = -\rho_c I_p \omega^2 \gamma(x) + \rho_c A(x)c(x)\omega^2(Z(x) - c(x)\gamma(x)) = 0 \quad (14b)$$

where G is the shear modulus, K is a geometric function of the cross section, $\rho_c$ is the density, L is the length, $I_p$ the polar moment of inertia about the centroid, A is the cross section of the cantilever, E is Young's modulus, $I_y$ is the moment of inertia around the y-axis, $\gamma(x)$ is the torsional angular deviation from the equilibrium position along the cantilever, Z(x) is the lateral deflection along the cantilever when vibrating, and co is the radial frequency of oscillation and c(x) is the distance between the shear center and the centroid of the cantilever.

The lateral eigenmode shapes, $z_n(x)$, of non-bent rectangular cantilevers can be obtained analytically. Similarly, the eigenmodes $\gamma_n(x)$ of a rectangular cantilever beam undergoing pure torsional deformation about its major axis are known. The eigenmodes of many nonrectangular cantilevers for both flexural and torsional vibrations can be determined numerically for example by using the Ritz method.

Note that the uncalibrated torsional modal shapes □ and the lateral mode shapes z are entirely determined by the geometry of the cantilever (via the dependence of the parameters G, K, $I_p$, and $\rho_c$ on x (geometry) in case of $\gamma$ and E, $I_y$ and $\rho_c$ in case of Z, but not by their absolute values (material property)). The modal shapes $\gamma$ and z were pre-normalised such that $$\int_0^L z^2 dx = 1 \text{ and } \int_0^L \frac{w^2}{12}\gamma^2 dx = 1 \quad (15)$$

where w is the width of the cantilever. This simplifies fitting of equation 16 below. Note, however, that the method is independent of the pre-normalisation.

In order to solve equations 14a and 14b, c(x) is determined first, which depends on the bent shape of the cantilever u(x). Solutions of the differential equations 14a and 14b are given by linear superpositions of the functions $z_n$ and $\gamma_n$ with coefficients $\alpha_n$ and $\beta_n$ respectively, that have to be determined. Using the Ritz method this leads to a system of linear equations giving the frequencies ω and the corresponding eigenmodes.

In general the coupling between a torsional and a lateral mode is strongest if their frequencies are close. The torsional mode will therefore in most cases couple to the nearest lateral mode only. In many cases it is sufficient to consider the coupling between one torsional mode γ and one lateral mode z (although more modes can be taken into account if necessary).

Without coupling two independent values for the torsional and the lateral frequency $\omega_t$ and $\omega_1$ are obtained. For the coupled oscillations also two values ω are obtained for the two (coupled) modes:

$$\omega^2 = \frac{\omega_t^2 + (1+I_1)\omega_l^2 \pm \sqrt{(\omega_t^2 + (1+I_1)\omega_l^2)^2 + 4I_2^2\omega_t^2\omega_l^2}}{2(1+I_1-I_2^2)} \quad (16)$$

$$\text{with } I_1 = \int_0^L \rho_c A c^2 \gamma^2 dx \quad (17a)$$

$$\text{and } I_2 = \int_0^L \left( \int \rho_c A c z d\gamma + \int \rho_c A c \gamma dz \right) dx \quad (17b)$$

The coupling is determined by the two integrals $I_1$ and $I_2$ via c(x) and hence the bent shape u(x).

Figure 6:
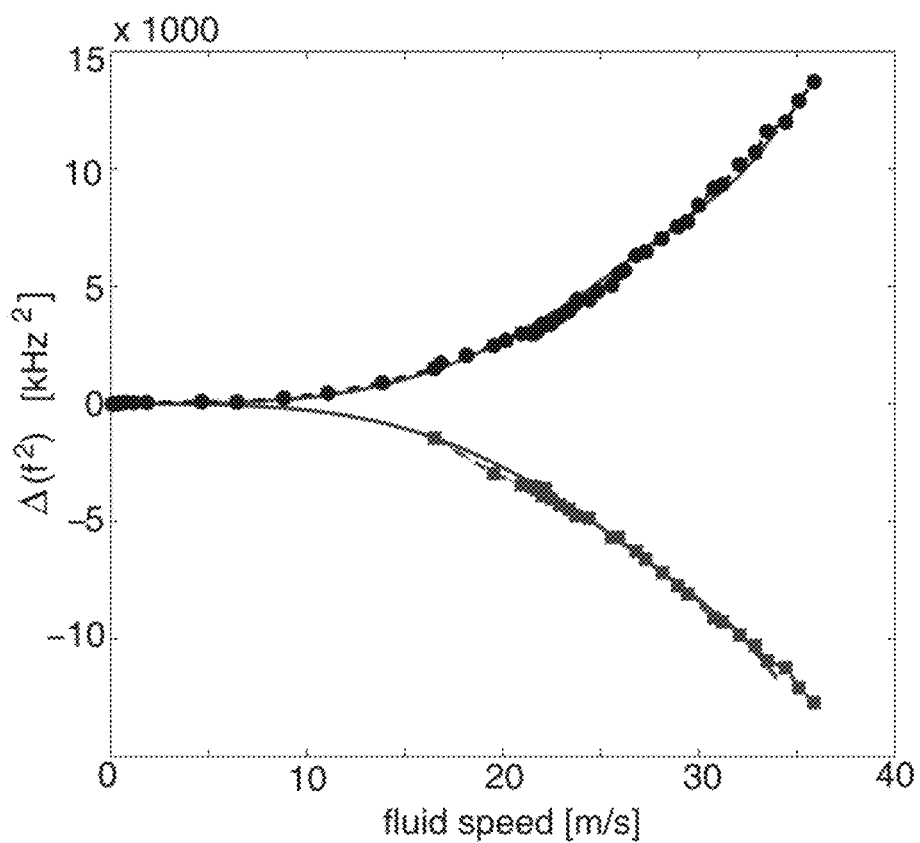
FIG. 6 is a measurement of two differences in fundamental frequency squared $\Delta(f^2)$ obtained for a rectangular cantilever as a function of an applied fluid speed corresponding to torsional shift (circles) and lateral shift (squares) respectively.

FIG. 6 shows the results of the change of the first torsional and the first lateral resonance frequency (dashed lines) for a rectangular cantilever depending on the speed of the fluid escaping from a microchannel as described above together with a fit (solid lines). The cantilever used had the following dimensions: a nominal length 350 μm (measured 340 μm), a width of 35 μm (measured 31 μm), and a thickness of 2 μm. The channel was oriented normal to the cantilever length and the cantilever was about 50 μm above the channel exit (see FIG. 2).

The flexural rigidity of the cantilever was determined beforehand independently to determine the resulting static bending u depending on the fluid flow. The forces exerted by the fluid were determined with the open-source, multi-physics software package Elmer (http://www.csc.fi/elmer). The solver module of Elmer utilizes the Finite Element Method. Note that the static equilibrium bending shape u(x) could also be determined with other methods (for example via interferometry, with a scanning laser Doppler vibrometer, or by taking a photo if the cantilever and its deflection are large enough).

In equation 16 two parameters, one for γ and one for z, were fitted, such that the theoretical frequency shifts match those observed in the experiment. This allows normalisation of the eigenmode functions $\gamma_1(x)$ and $z_1(x)$ such that:

$$\int_0^L \rho_c(x) I_p(x) \gamma_1^2(x) dx = 1. \quad (18a)$$

and $$\int_0^L \rho_c(x) A(x) z_1^2(x) dx = 1 \quad (18b)$$

With this normalised function, p, the torsional spring constant $k_\square$ for a torque applied at the free end of the cantilever is obtained from equation 11. It should be noted that when the lateral mode has been normalised independently beforehand, only a single parameter needs to be determined.

The procedure described above results in a dynamic torsional spring constant of 4.5e-9 Nm, corresponding to a static torsional spring constant of 3.7e-9 Nm for the above mentioned cantilever. For comparison: the Sader method gives a value of 3.1.e-9 Nm (L=341 μm, w=31 μm, f=358 kHz, Q=130) for the static torsional spring constant corresponding to a dynamic value of 3.8e-9 Nm. Calculation for an 'ideal' cantilever predicts a dynamic value of 9.8e-9 Nm and a static value of 8.0e-9 Nm.

In case of atomic force microscopy the 'lateral' spring constant, $k_1$, relevant in connection with measuring a lateral force when the tip of an AFM cantilever is in contact with a surface, can be obtained from $k_\square$ via equation 12.

A lateral force here causes a torsional twist of the cantilever which in fact is measured.

This 'lateral' spring constant however is different from the lateral spring constant that can be obtained from the normalized $z_1$ above:

$$k_{lat,1} = \frac{\omega_{lat,1}^2}{z_1^2(L)} \quad (18)$$

The latter corresponds to the stiffness of the cantilever to true lateral deflections. For the cantilever above a lateral spring constant of ~57 N/m resulted. It is difficult to obtain this value experimentally in Atomic Force Microscopy or for microcantilevers, because a lateral movement can in general not be detected with the standard readout system for microcantilevers. A rough estimate can be obtained based on the flexural spring constant and the assumption of an 'ideal' cantilever where all dimensions are accurately known, or theoretically by assuming knowledge of all dimensions and materials properties. The latter gives a value of ~64 N/m.

The torsional rigidity, GK, for a rectangular cantilever can be obtained from equation 13 above.

The above disclosure demonstrates that with knowledge of the shape of a cantilever and a measure of the resonance frequency of the cantilever in a plurality of static equilibrium positions in which the shape of the cantilever is different, the spring constant and/or rigidity of the cantilever can be determined. In situations where the spring constant and/or rigidity are known, the invention can equally be used to determine a fluid flow rate and/or the force applied to a cantilever. To do this, the resonance frequency of the cantilever would be measured when the fluid is applied and the cantilever is in a static equilibrium position. The shape/deflection of the cantilever caused by the fluid flow when the cantilever is in its static equilibrium position would then be measured, for example using optical techniques. The measured resonance frequency and the determined shape/deflection could then be used to provide a measure of the fluid flow rate and/or the force applied to a cantilever. If an absolute measure of fluid flow rate or force is needed, then the resonance frequency of the cantilever in its unbent condition would have to be known. If a relative measure of fluid flow rate or force is needed, then measurements in different cantilever bent positions would be required. As above, the measured resonance frequency may be at least one of a torsional resonance frequency, and a lateral resonance frequency. Equally, the spring constant may be at least one of a torsional spring constant, and a lateral spring constant and the rigidity may be a torsional rigidity, and/or a lateral rigidity.

The method of the invention can be performed in situ and does not involve direct contact of the cantilever with another object. A system for measuring the resonant torsional frequency for implementing the method can be incorporated in microfluidic systems and atomic force microscopes.

A skilled person will appreciate that variations of the disclosed arrangements are possible without departing from the invention. For example, whilst the invention has been described with reference to a cantilever that does not have a tip, it can be applied to a cantilever that has a tip at its end, for example an atomic force microscope cantilever. Also, torsional or lateral movements of the cantilever could be actively driven by cycling the base of the cantilever. Equally, whilst coupling between the torsional and lateral modes is described, the invention could apply to coupling between torsional and flexural modes. Accordingly, the above description of the specific embodiment is made by way of example only and not for the purposes of limitation. It will be clear to the skilled person that minor modifications may be made without significant changes to the operation described.

The invention claimed is:

1. A method for determining a spring constant/rigidity corresponding to at least one of a torsional or a lateral mode of a cantilever of a known shape, the method comprising the steps of:
   positioning the cantilever at a height greater than a height of a fluid supply and in a plurality of static equilibrium positions, the fluid supply comprising a microchannel having an exit, the cantilever being fixed at a first end and free at a second end, the cantilever being positioned such that the microchannel is oriented perpendicular to a longitudinal axis of the cantilever when the cantilever is in a natural, unbent state;
   applying a fluid flow, from the exit of the microchannel of the fluid supply, to place the cantilever into a subset of the plurality of static equilibrium positions, the fluid flow being directed, via the exit of the microchannel, onto the cantilever in a direction that is perpendicular to the longitudinal axis of the cantilever when the cantilever is in the natural, unbent state, the natural, unbent state being a state in which a centroid and a shear-center of the cantilever coincide relative to one another;
   measuring, via a deflection detection system, a resonance frequency of the cantilever in the subset of the plurality of static equilibrium positions in which the shape of the cantilever is different and the torsional and lateral modes are coupled;
   and determining at least one of a spring constant or a rigidity of the cantilever using the measured frequencies, wherein:
   the measured resonance frequency is at least one of a torsional resonance frequency or a lateral resonance frequency;
   at least one of:
   the spring constant is at least one of a torsional spring constant or a lateral spring constant, or the rigidity is at least one of a torsional rigidity or a lateral rigidity;
   the applied fluid flow causes a static flexural bending of the cantilever in the subset of the plurality of static equilibrium positions, the static flexural bending being such that, in the subset of the plurality of static equilibrium positions, a distance between the centroid and the shear-center of the cantilever is provided thereby to cause coupling between the torsional and lateral modes;
   and the coupling between the torsional and lateral modes is caused without increasing a mass of the cantilever, the coupling between the torsional and lateral modes being dependent on at least the distance between the centroid and the shear-center of the cantilever.

2. A method as claimed in claim 1, wherein the torsional resonance frequency and the lateral resonance frequency are both measured.

3. A method as claimed in claim 1, wherein the step of determining the spring constant/rigidity involves using a theoretical model of the cantilever in the different static equilibrium positions.

4. A method as claimed in claim 3, further comprising the steps of:
   either (a) comparing the measured frequencies with the theoretical model of the cantilever in the different static equilibrium positions or (b) comparing a function of the measured frequencies with the theoretical model of the cantilever in the different static equilibrium positioned; and
   using the results of the comparison to determine the spring constant/rigidity of the cantilever.

5. A method as claimed in claim 3, further comprising the steps of:
   modelling a variation in frequency as a function of equilibrium position;
   extracting from the model a normalisation factor that depends on material properties of the cantilever;
   calculating a normalised mode using the normalisation factor; and
   using the normalised mode and corresponding resonance frequency to determine the spring constant and/or rigidity of the cantilever.

6. A method as claimed in claim 5 for determining a torsional spring constant and/or rigidity of the cantilever, wherein the frequency variation is a variation in torsional frequency and the normalised mode is a normalised torsional angular mode.

7. A method as claimed in claim 5 for determining a lateral spring constant and/or rigidity of the cantilever, wherein the frequency variation is a variation in lateral frequency and the normalised mode is a normalised lateral mode.

8. A method as claimed in claim 1, wherein the resonance frequency is the fundamental resonance frequency.

9. A method as claimed in claim 1, wherein measuring the resonance frequencies involves optical detection.

10. A method as claimed in claim 1, further comprising the steps of:
    determining or measuring a shape of the cantilever in each of the plurality of static equilibrium positions; and
    using the shape to determine the spring constant and/or rigidity of the cantilever.

11. A method as claimed in claim 1, wherein the cantilever is unloaded.

12. A method of calibrating a cantilever based instrument using the cantilever spring constant and/or rigidity determined by the method of claim 1.

13. A system for measuring at least one of a spring constant or a rigidity corresponding to at least one of a torsional or a lateral mode of a cantilever, the system comprising:
- a cantilever provided in an initial static equilibrium position;
- means for deforming the cantilever to cause it to move to a subset of a plurality of static equilibrium positions in which a shape of the cantilever is different, the means comprising a microchannel having an exit, the cantilever being fixed at a first end and free at a second end, the cantilever being positioned such that the microchannel is oriented perpendicular to a longitudinal axis of the cantilever when the cantilever is in a natural, unbent state, the exit of the microchannel being configured for providing a fluid flow onto the cantilever in a direction perpendicular to the longitudinal axis of the cantilever when the cantilever is in the natural, unbent state, the natural, unbent state being a state in which a centroid and a shear-center of the cantilever coincide relative to one another;
- measuring means for measuring a resonance frequency of the cantilever in each of the subset of the plurality of static equilibrium positions in which the torsional and lateral modes are coupled;
- and a processor for determining at least one of the spring constant or the rigidity of the cantilever using the measured resonance frequencies and a theoretical model based on the shape of the cantilever, wherein:
- the applied fluid flow causes a static flexural bending of the cantilever in the subset of the plurality of static equilibrium positions, the static flexural bending being such that, in the subset of the plurality of static equilibrium positions, a distance between the centroid and the shear-center of the cantilever is provided thereby to cause coupling between the torsional and lateral modes;
- the coupling between the torsional and lateral modes is caused without increasing a mass of the cantilever, the coupling between the torsional and lateral modes being dependent on at least the distance between the centroid and the shear-center of the cantilever;
- and at least one of:
- the measured resonance frequency is at least one of a torsional resonance frequency or a lateral resonance frequency;
- the spring constant is at least one of a torsional spring constant or a lateral spring constant;
- or the rigidity is at least one of a torsional rigidity or a lateral rigidity.

14. A system as claimed in claim 13, wherein the fluid flow is a laminar fluid flow.

15. A system as claimed in claim 13, wherein the measuring means comprises an optical means.

16. A microfluidic system having a cantilever and a system according to claim 13.

17. A method for determining at least one of a fluid flow or a force applied to a cantilever of known spring constant/rigidity corresponding to at least one of a torsional mode or a lateral mode and known shape, the method comprising steps of:
- positioning the cantilever at a height greater than a height of a fluid supply and in a static equilibrium position, the fluid supply comprising a microchannel having an exit, the cantilever being fixed at a first end and free at a second end, the cantilever being positioned such that the microchannel is oriented perpendicular to a longitudinal axis of the cantilever when the cantilever is in a natural, unbent state;
- applying a fluid flow, from the exit of the microchannel of the fluid supply, to the cantilever, the fluid flow being directed, via the exit of the microchannel, onto the cantilever in a direction that is perpendicular to the longitudinal axis of the cantilever when the cantilever is in the natural, unbent state, the natural, unbent state being a state in which a centroid and a shear-center of the cantilever coincide relative to one another;
- measuring, via a deflection detection system, a resonance frequency of the cantilever when the fluid flow is applied to the cantilever and the cantilever is in the static equilibrium position and the torsional and lateral modes are coupled;
- determining, via the deflection detection system, the shape/deflection of the cantilever caused by the fluid flow when the cantilever is in its static equilibrium position and the torsional and lateral modes are coupled;
- and determining the fluid flow and/or force applied to the cantilever using the measured resonance frequency and the determined shape/deflection, wherein:
- the applied fluid flow causes a static flexural bending of the cantilever in the static equilibrium position, the static flexural bending being such that, in the static equilibrium position, a distance between the centroid and the shear-center of the cantilever is provided thereby to cause coupling between the torsional and lateral modes;
- the coupling between the torsional and lateral modes is caused without increasing a mass of the cantilever, the coupling between the torsional and lateral modes being dependent on at least the distance between the centroid and the shear-center of the cantilever;
- and at least one of:
- the measured resonance frequency is at least one of a torsional resonance frequency or a lateral resonance frequency;
- the spring constant is at least one of a torsional spring constant or a lateral spring constant;
- or the rigidity is at least one of a torsional rigidity or a lateral rigidity.

18. A system for determining fluid flow and/or force applied to a cantilever of known spring constant/rigidity corresponding to at least one of a torsional or a lateral mode and known shape, the system comprising:
- a fluid supply having a microchannel with an exit;
- a cantilever positioned at a height greater than a height of the fluid supply and provided in a static equilibrium position, the cantilever being fixed at a first end and free at a second end, the cantilever being positioned such that the microchannel is oriented perpendicular to a longitudinal axis of the cantilever when the cantilever is in a natural, unbent state, the natural, unbent state being a state in which a centroid and a shear-center of the cantilever coincide relative to one another;
- a deflection detection system being configured to:
- measure a resonance frequency of the cantilever when:
  - (a) a fluid flow from the fluid supply is applied, via the exit of the microchannel, onto the cantilever and in a direction perpendicular to the longitudinal axis of the cantilever when the cantilever is in the natural, unbent state;
  - (b) the cantilever is in a static equilibrium position;
  - (c) and the torsional and lateral modes are coupled;

and determine the shape/deflection of the cantilever caused by the fluid flow when the cantilever is in the static equilibrium position and the torsional and lateral modes are coupled, wherein:

the applied fluid flow causes a static flexural bending of the cantilever in the static equilibrium position, the static flexural bending being such that, in the static equilibrium position, a distance between the centroid and the shear-center of the cantilever is provided thereby to cause coupling between the torsional and lateral modes;

the coupling between the torsional and lateral modes is caused without increasing a mass of the cantilever, the coupling between the torsional and lateral modes being dependent on at least the distance between the centroid and the shear-center of the cantilever;

and at least one of:

the measured resonance frequency is at least one of a torsional resonance frequency or a lateral resonance frequency;

the spring constant is at least one of a torsional spring constant or a lateral spring constant;

or the rigidity is at least one of a torsional rigidity or a lateral rigidity.

19. A system as claimed in claim 18, wherein said system is configured to determine the fluid flow and/or force applied to the cantilever using the measured resonance frequency and the determined shape/deflection.

* * * * *